(12) United States Patent
Hueschen

(10) Patent No.: US 6,878,975 B2
(45) Date of Patent: Apr. 12, 2005

(54) POLARIZATION FIELD ENHANCED TUNNEL STRUCTURES

(75) Inventor: Mark R. Hueschen, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/071,439

(22) Filed: Feb. 8, 2002

(65) Prior Publication Data

US 2003/0151042 A1 Aug. 14, 2003

(51) Int. Cl.⁷ .............................................. H01L 29/885
(52) U.S. Cl. ......................... 257/104; 257/12; 257/13; 257/99; 257/106; 257/614; 257/615
(58) Field of Search ............................. 257/12, 13, 99, 257/104, 106, 614, 615

(56) References Cited

U.S. PATENT DOCUMENTS

| 4,806,998 | A | | 2/1989 | Vinter et al. |
|---|---|---|---|---|
| 4,829,355 | A | | 5/1989 | Munier et al. |
| 5,366,927 | A | | 11/1994 | Schetzina |
| 5,679,965 | A | | 10/1997 | Schetzina |
| 5,729,029 | A | | 3/1998 | Rudaz |
| 5,786,603 | A | | 7/1998 | Rennie et al. |
| 5,804,834 | A | | 9/1998 | Shimoyama et al. |
| 5,909,036 | A | | 6/1999 | Tanaka et al. |
| 5,930,133 | A | * | 7/1999 | Morizuka .................... 363/126 |
| 5,936,266 | A | | 8/1999 | Holonyak, Jr. et al. |
| 6,046,464 | A | | 4/2000 | Schetzina |
| 6,100,586 | A | | 8/2000 | Chen et al. |
| 6,150,672 | A | | 11/2000 | Kaneko |
| 6,329,676 | B1 | * | 12/2001 | Takayama et al. ............ 257/95 |
| 6,365,911 | B1 | * | 4/2002 | Furuyama ..................... 257/25 |
| 6,526,082 | B1 | * | 2/2003 | Corzine et al. ............... 372/46 |
| 6,555,451 | B1 | * | 4/2003 | Kub et al. ................... 438/542 |
| 6,724,013 | B2 | * | 4/2004 | Kneissl et al. ................ 257/79 |

* cited by examiner

*Primary Examiner*—Bradley William Baumeister

(57) ABSTRACT

A novel tunnel structure is described that enables tunnel diode behavior to be exhibited even in material systems in which extremely heavy doping is impossible and only moderate or light doping levels may be achieved. In one aspect, the tunnel heterostructure includes a first semiconductor layer, a second semiconductor layer, and an intermediate semiconductor layer that is sandwiched between the first and second semiconductor layers and forms first and second heterointerfaces respectively therewith. The first and second heterointerfaces are characterized by respective polarization charge regions that produce a polarization field across the intermediate semiconductor layer that promotes charge carrier tunneling through the intermediate semiconductor layer. In another aspect, the invention features a semiconductor structure having a p-type region, and the above-described heterostructure disposed as a tunnel contact between the p-type region of the semiconductor structure and an adjacent n-type region.

18 Claims, 4 Drawing Sheets

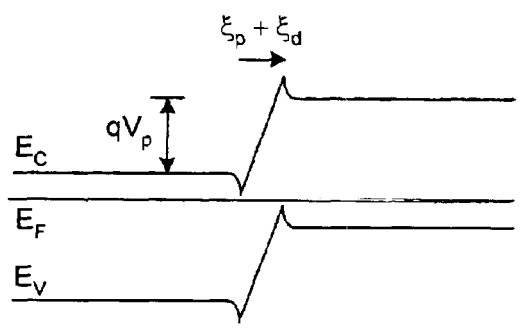 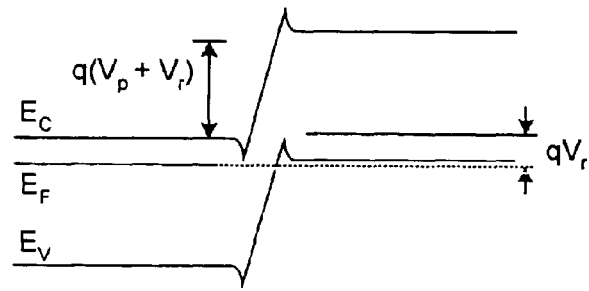
FIG. 5A                    FIG. 5B
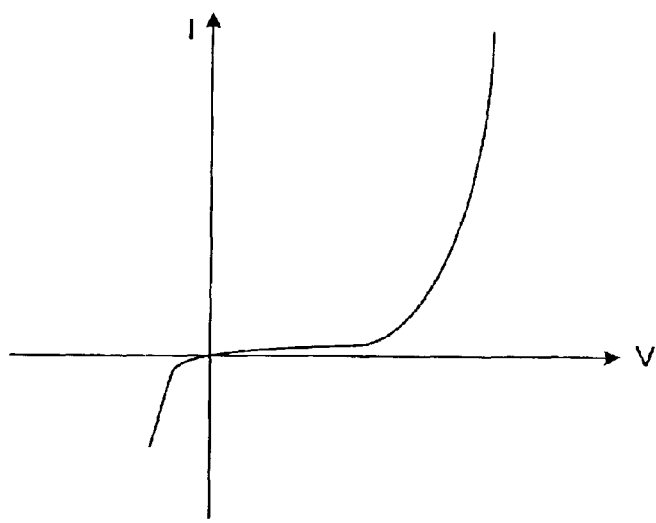
FIG. 6

POLARIZATION FIELD ENHANCED TUNNEL STRUCTURES

TECHNICAL FIELD

This invention relates to polarization field enhanced tunnel structures.

BACKGROUND

Many different tunnel structures have been developed, including tunnel diode structures. A typical tunnel diode is formed from a p-n junction in which both n and p sides are degenerate (i.e., very heavily doped with impurities). The high doping levels bend the conduction and valence bands over a short distance (e.g., on the order of 10 nm, or less) such that conduction band electron states at the Fermi level on the n side are aligned with valence band states at the Fermi level on the p side. This phenomenon allows charge carriers to tunnel across the depletion layer upon application of an arbitrarily small forward or reverse bias across the p-n junction. Beyond a particular forward bias level, the available charge carrier tunnel states do not overlap, resulting in a region of negative differential resistance (i.e., where the current exhibits a decrease in value when the value of the voltage is increased).

In general, several conditions must be satisfied to achieve such a tunnel diode structure. For example, the n and p sides of the tunnel structure must be degenerately doped. This condition requires a combination of heavy doping levels and low dopant ionization energies. In addition, the tunnel distance must be sufficiently short to enable charge carriers to tunnel across the depletion region with a relatively high probability. This condition requires very heavy doping levels. One or more of these tunneling conditions cannot be satisfied in certain semiconductor material systems. For example, in many semiconductors (especially wide bandgap semiconductors, such as III-V nitride and II-VI semiconductors) heavy doping of the n side or the p side, or both, is difficult or impossible to achieve. In addition, in these semiconductor material systems, dopant ionization energies often are relatively high, especially for p-type dopants. The combined effect of these limitations makes it difficult or impossible to fabricate tunnel diode structures that operate at moderate reverse voltages, much less operate at nearly zero voltage.

SUMMARY

The invention provides a novel tunnel structure that enables tunnel diode behavior to be exhibited even in material systems in which extremely heavy doping is impossible and only moderate or light doping levels may be achieved.

In one aspect, the invention features a heterostructure that includes a first semiconductor layer, a second semiconductor layer, and an intermediate semiconductor layer that is sandwiched between the first and second semiconductor layers and forms first and second heterointerfaces respectively therewith. The first and second heterointerfaces are characterized by respective polarization charge regions that produce a polarization field across the intermediate semiconductor layer that promotes charge carrier tunneling through the intermediate semiconductor layer.

Embodiments of the invention may include one or more of the following features.

The intermediate semiconductor layer preferably has a thickness (D) that enables charge carriers to tunnel through the intermediate semiconductor layer with a current density greater than 1 A/cm$^2$. In some embodiments, the polarization field may have a magnitude ($\xi_p$) with a value that is on the order of $(E_{c,1}-E_{v,2})/(q \cdot D)$, wherein $E_{c,1}$ is a relative conduction band energy at the first heterointerface, $E_{v,2}$ is a relative valence band energy at the second heterointerface, q is a unit carrier charge, and D is the thickness of the intermediate semiconductor layer. The polarization field may have a magnitude ($\xi_p$) that is sufficient to align an occupied conduction band state at the first heterointerface with an unoccupied valence band state at the second heterointerface.

The first semiconductor layer preferably is doped n-type and the second semiconductor layer preferably is doped p-type. The polarization field preferably enhances a dopant-induced drift field that is produced between the first and second semiconductor layers.

The first and second semiconductor layers may be formed from the same semiconductor material. For example, in one embodiment, the first and second semiconductor layers may be formed from GaN and the intermediate semiconductor layer may be formed from AlGaN. In another embodiment, the first and second semiconductor layers may be formed from GaN and the intermediate semiconductor layer may be formed from InGaN.

The polarization charge regions may form as a result of spontaneous polarization differences between the two materials, or piezoelectric polarization, or both.

In those embodiments exhibiting spontaneous polarization, the first, second and intermediate semiconductor layers are characterized by crystallographic structures allowing spontaneous polarization charge formation at the first and second heterointerfaces. In some of these embodiments, each of the first, second and intermediate semiconductor layers may have a hexagonal crystallographic structure. The first, second and intermediate semiconductor layers may be formed from a III-V nitride semiconductor material, such as GaN, AlGaN, InGaN, AlN, InN, InAlN. In other embodiments exhibiting spontaneous polarization, each of the first, second and intermediate semiconductor layers may be formed from a II-VI semiconductor material.

In another aspect, the invention features a semiconductor structure having a p-type region, and the above-described heterostructure disposed as a tunnel contact junction between the p-type region of the semiconductor structure and an adjacent n type region.

In some embodiments in accordance with this aspect of the invention, the semiconductor structure includes a light emitting region.

The inventive tunnel heterostructures described herein may be used advantageously in conventional tunnel diode applications (such as microwave oscillators) that depend on the negative differential resistance under forward bias. They can also be used under reverse bias as "leaky" diodes to provide low-voltage drop contacts in material systems in which such contacts are difficult or impossible to achieve. Such low-voltage drop contacts may be used to reduce forward voltages, reduce self-heating and increase power efficiency of semiconductor devices in general, and may be used to reduce the lasing thresholds of semiconductor light-emitting diodes and semiconductor lasers in particular. In addition, the inventive tunnel heterostructure may be used in semiconductor devices (e.g., light emitting semiconductor devices) as a hole source. In this way, the invention allows low mobility and high resistance p-type conductivity channels to be replaced by high mobility and low resistance n-type conductivity channels to improve device performance.

Other features and advantages of the invention will become apparent from the following description, including the drawings and the claims.

DESCRIPTION OF DRAWINGS

FIG. 5A is a diagrammatic view of the valence and conduction bands for a polarization field enhanced tunnel heterostructure in which the internal polarization field is insufficient to enable tunneling current to flow at nearly zero applied bias.

FIG. 5B is a diagrammatic view of the valence and conduction bands for the heterostructure of FIG. 5A subject to a moderate reverse applied bias.

FIG. 6 is a diagrammatic current-voltage plot for the heterostructure of FIG. 5A.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
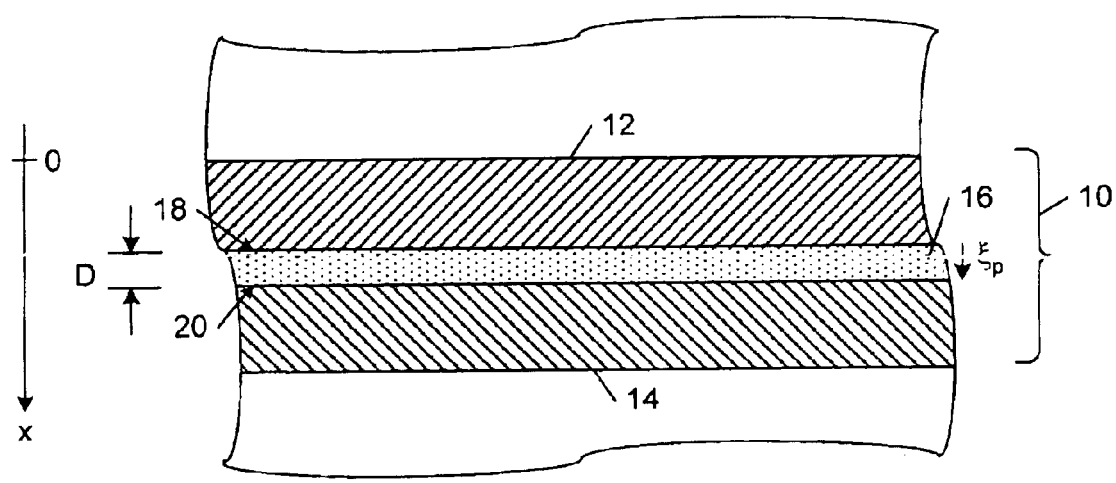
FIG. 1 is a diagrammatic cross-sectional view of a polarization field enhanced tunnel heterostructure.

Referring to FIG. 1, in one embodiment, a polarization field enhanced tunnel heterostructure 10 includes a first semiconductor layer 12, a second semiconductor layer 14, and an intermediate semiconductor layer 16. Intermediate semiconductor layer 16 is sandwiched between the first and second semiconductor layers 12, 14, and forms first and second heterointerfaces 18, 20 respectively therewith. First semiconductor layer 12 may be doped n-type, and second semiconductor layer 14 may be doped p-type. Intermediate semiconductor layer 16 has a thickness (D) that is sufficiently thin to enable charge carriers to tunnel through intermediate semiconductor layer 16 with a substantial probability. For example, in some embodiments, intermediate semiconductor layer 16 may have a thickness that is sufficiently thin to enable charge carriers to tunnel through intermediate semiconductor layer 16 with a current density greater than 1 A/cm². In some embodiments, intermediate semiconductor layer 16 has a thickness that is on the order of about 10 nm, or less. Heterostructure 10 may be formed on a semiconductor wafer (e.g., a silicon wafer or a gallium arsenide wafer), a magnesium oxide substrate, a sapphire substrate, the top surface of a single semiconductor layer, or the top surface of a multilayer structure that includes, for example, a semiconductor device (e.g., a light-emitting diode or a semiconductor laser) that is formed on a semiconductor wafer.

Figure 2:
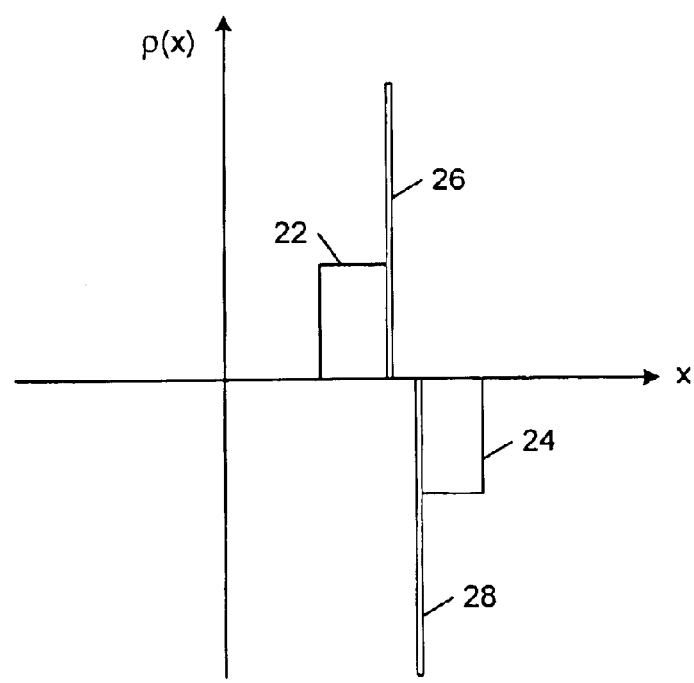
FIG. 2 is a diagrammatic plot of space charge density ($\rho(x)$) through the heterostructure of FIG. 1.

As shown in FIG. 2, at zero bias heterostructure 10 includes a depletion region with a positive space charge region 22 and a negative space charge region 24 that form as a result of the n and p doping of first and second semiconductor layers 12, 14, respectively. In addition, the first and second heterointerfaces 18, 20 include positive and negative polarization charge regions 26, 28, respectively. Polarization charge regions 26, 28 may form from differences in spontaneous polarization between adjacent layers, or from piezoelectric polarization due to strain in one or more of the layers, or from a combination of both spontaneous polarization and piezoelectric polarization. The more abrupt the heterointerface, the narrower the polarization charge region will be. The invention includes both abrupt and graded heterointerfaces. Piezoelectric polarization results from strain due to differences in lattice constant among layers 12, 14, 16. For example, the strain that is produced in the InGaN layer of a GaN/InGaN/GaN heterostructure produces a substantial piezoelectric field across the InGaN intermediate layer.

In general, intermediate semiconductor layer 16 is formed from a material that is different from the constituent materials of the first and second semiconductor layers 12, 14. First and second semiconductor layers 12, 14 may be formed from the same or different materials. First, second and intermediate semiconductor layers 12, 14, 16 may be formed from any semiconductor material system that exhibits internal polarization fields, including semiconductor materials having a hexagonal crystallographic structure, III-V nitride semiconductors (e.g., GaN, AlGaN, InGaN, AlN, InN, InAlN), and II-VI semiconductors (e.g., ZnSe, ZnSSe, ZnCdSe, ZnHgSe, HgSe, ZnTeSe). For example, in one embodiment, heterostructure 10 may be formed from GaN/InGaN/GaN.

As explained in detail below, polarization charge regions 26, 28 produce a polarization field ($\xi_p$) across intermediate semiconductor layer 16 that promotes charge carrier tunneling through intermediate semiconductor layer 16.

Figure 3A:
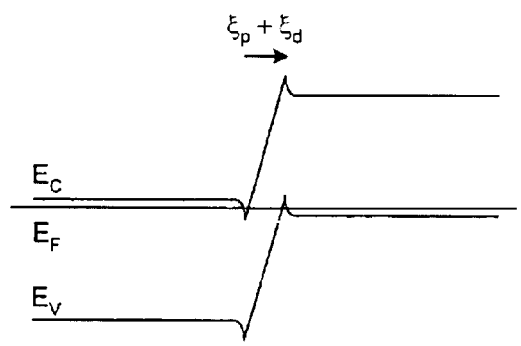
FIG. 3A is a diagrammatic view of the valence and conduction bands for a polarization field enhanced tunnel heterostructure in which the internal polarization field is sufficient to enable tunneling current to flow at nearly zero applied bias.
Figure 3B:
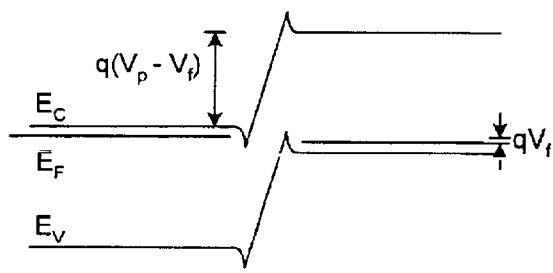
FIG. 3B is a diagrammatic view of the valence and conduction bands for the heterostructure of FIG. 3A subject to a moderate forward applied bias.
Figure 3C:
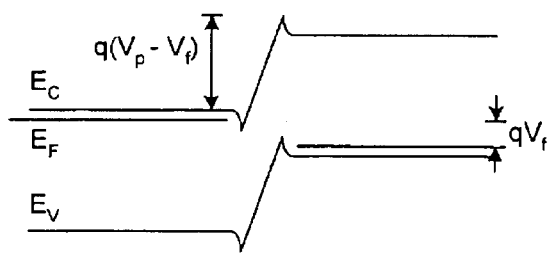
FIG. 3C is a diagrammatic view of the valence and conduction bands for the heterostructure of FIG. 3A subject to a large forward applied bias.
Figure 4:
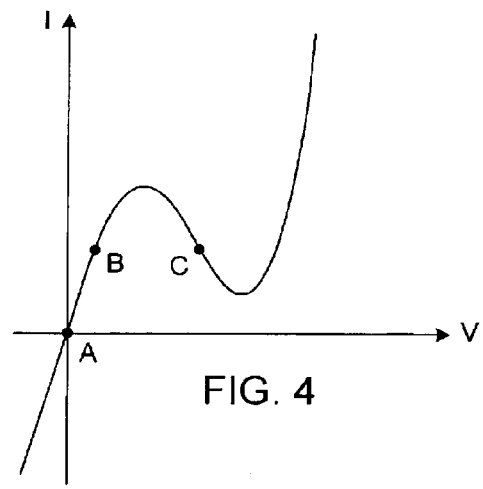
FIG. 4 is a diagrammatic current-voltage plot for the heterostructure of FIG. 3A.

Referring to FIGS. 3A, 3B, 3C and 4, in one embodiment, the polarization field ($\xi_p$) has a magnitude that is sufficient to enable tunneling at infinitesimal applied bias. In particular, the polarization field magnitude (together with the dopant-induced drift field, $\xi_d$) is sufficient to align conduction band states near the Fermi level (EF) at the first heterointerface 18 with valence band states the Fermi level (EF) at the second heterointerface 20. At zero bias (FIG. 3A), the number of electrons that tunnel from the conduction band of layer 12 to the valence band of layer 14 is as many as the number of electrons that tunnel in the opposite direction. Therefore, at zero bias, the tunneling current is zero (see point A in FIG. 4). When a relatively small forward bias ($V_f$) is applied (FIG. 3B), however, the quasi Fermi levels are split by an amount equal to $qV_f$. There are now a large number of empty states in layer 14 available for electrons to tunnel from the conduction band in the n-doped first semiconductor layer 12. As a result, tunneling current may flow (see point B in FIG. 4). When the forward bias is increased further, the available charge carrier tunneling states do not overlap and no states are available for direct tunneling (FIG. 3C). Under such conditions, the tunneling current drops (see point C in FIG. 4). The subsequent rise in the diode current is related to normal diode conduction mechanisms. Under reverse bias conditions, electrons tunnel from occupied states in the valence band of the p-type second semiconductor layer 14 into empty states of the conduction band of the n-type first semiconductor layer 12. The result is a "leaky" (or backward) diode with a relatively small voltage drop. As shown in FIG. 4, the resulting current-voltage characteristic is similar to that of a conventional tunnel diode. This polarization field enhanced tunnel heterostructure may be used for low-power microwave applications, such as local oscillation and frequency-locking circuits, as well as rectification of small signals, microwave detection, and mixing.

As mentioned above, in the embodiment of FIGS. 3A–4, the polarization field has a magnitude ($\xi_p$) that is sufficient to align conduction band states near $E_F$ at first heterointerface 18 with valence band states near $E_F$ at second heterointerface 20. That is, $\xi_p$ has a value that is on the order of $(E_{c,1} - E_{v,2})/(q \cdot D)$, where $E_{c,1}$ is a relative conduction band energy at first heterointerface 18, $E_{v,2}$ is a relative valence band energy at second heterointerface 20, q is a unit carrier charge, and D is the thickness of the intermediate semiconductor layer 16. In particular, in this embodiment, $\xi_p$ has a value that is greater than $(E_{c,1} - E_{v,2})/(q \cdot D) - \xi_d$, where $\xi_d$ is the value of the dopant-induced drift field through the intermediate semiconductor layer as shown in FIG. 3A. Consequently, although the intermediate semiconductor layer thickness (D) should be thin enough to enable charge carriers to tunnel therethrough, it should not be thinner than $(E_{c,1} - E_{v,2})/(q \cdot (\xi_p + \xi_d))$.

Referring to FIGS. 5A, 5B and 6, in some embodiments, the polarization field magnitude (together with the dopant-induced drift field) may be insufficient to align an occupied conduction band state at the first heterointerface 18 with an unoccupied valence band state at the second heterointerface 20 at zero applied bias (FIG. 5A). Consequently, such a heterostructure does not exhibit the negative differential resistance that is characteristic of the heterostructure discussed above in connection with FIGS. 3A–4. However, such a heterostructure still may be operated under reverse bias conditions to provide a "leaky" (or backward) diode with a relatively small voltage drop. Thus, as shown in FIG. 5B, only a relatively small reverse bias ($V_r$) is needed to initiate electron tunneling from occupied states in the valence band of the p-type second semiconductor layer 14 into empty states of the conduction band of the n-type first semiconductor layer 12. As shown in FIG. 6, under small bias conditions, the current in the reverse direction is larger than the current in the forward direction. This polarization field enhanced tunnel heterostructure may be used for rectification of small signals, microwave detection, and mixing.

Although the above discussion focuses on electron tunneling current, holes also may tunnel through intermediate semiconductor layer 16. In most cases, however, holes are heavier than electrons and, as a result, holes have a much lower tunneling probability than electrons. In addition, in the above discussion, the bandgaps of the first, second and intermediate semiconductor layers 12, 14, 16 are shown as having the same magnitude for illustrative purposes. In actual embodiments, however, the bandgap of intermediate semiconductor layer 16 would be different from the bandgaps of first and second semiconductor layers 12, 14. In many applications, it will be advantageous for layer 16 to have a smaller bandgap in order to increase the tunneling current. The bandgaps of first and second semiconductor layers 12, 14 on the other hand, may be the same or different, depending upon their respective material compositions.

The polarization field enhanced tunnel heterostructures of FIGS. 3A–4 and 5A–6 may be used to provide low-voltage drop contacts between adjacent n-type and p-type conducting layers in device structures in which it is difficult to achieve low-resistance contacts to p-type conducting layers. For example, in many semiconductors, the maximum achievable p-type conductivity is significantly worse than the n-type conductivity. The relatively poor p-type conductivity limits device performance by increasing the access resistance to the active regions of the device. In such situations, significant performance improvements may be realized by incorporating a leaky p-n junction diode into the structure to replace the p-type conductivity with an n-type conducting layer. By incorporating one of the above-described polarization enhanced tunnel heterostructures into such a material system, a low-voltage drop p contact junction may be created even when extremely heavy doping is impossible and only moderate or light doping levels may be achieved. For example, polarization field enhanced tunnel heterostructure 10 may be implemented as a leaky diode to provide a low-voltage drop p contact junction in many different devices, including light emitting diodes and semiconductor lasers (e.g., an edge-emitting laser or a vertical cavity surface emitting laser).

Figure 7:
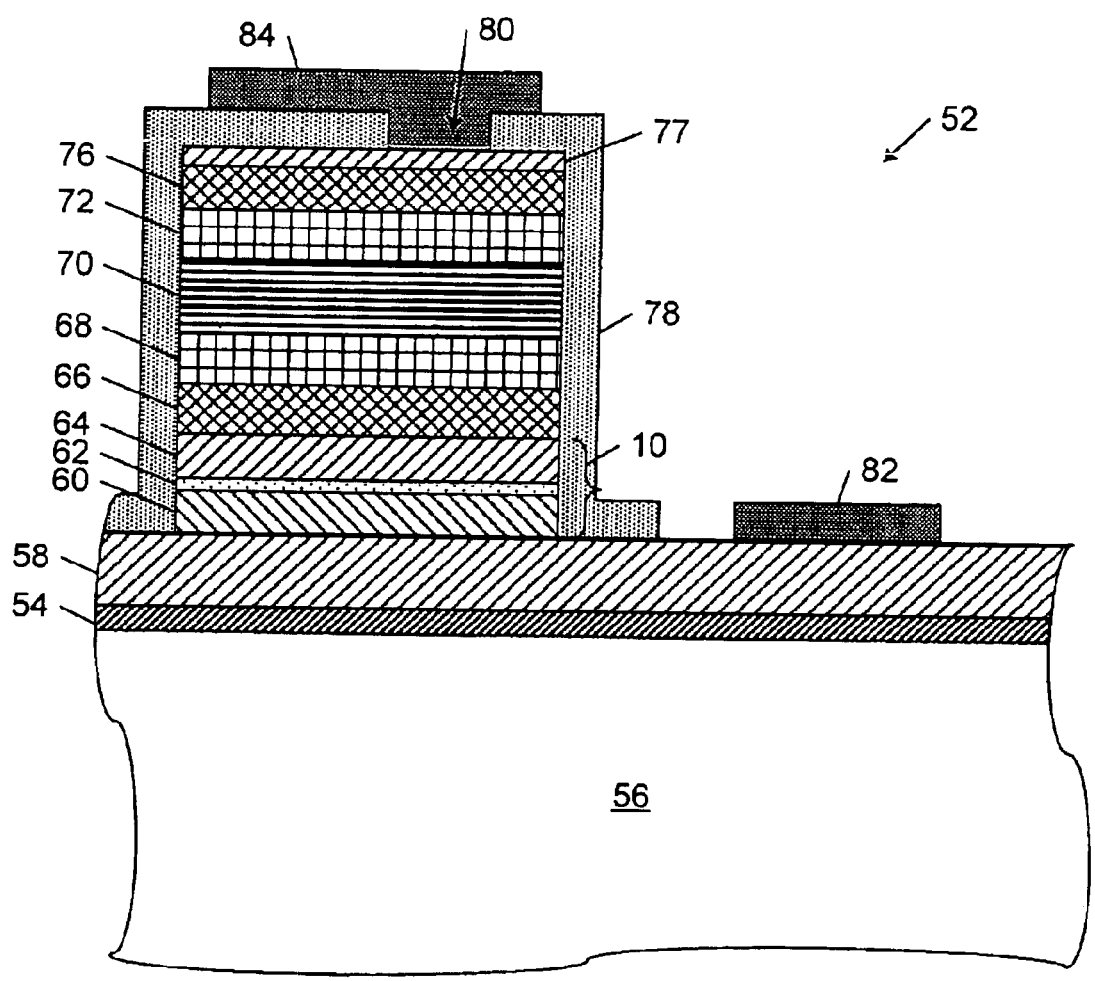
FIG. 7 is a diagrammatic cross-sectional side view of a semiconductor laser that includes a polarization field enhanced leaky diode tunnel contact junction that enables the p-side of the laser to be driven by lateral conduction through a high mobility and low resistive voltage drop n-type contact layer.

As shown in FIG. 7, in one embodiment, polarization field enhanced tunnel heterostructure 10 may operate as a tunnel contact junction in a semiconductor laser 52. Laser 52 may be formed from InGaN and AlGaN alloys. In this embodiment, a GaN buffer layer 54 may be formed on a sapphire substrate 56. An n-type GaN contact layer 58 may be formed between the GaN buffer layer 54 and polarization field enhanced tunnel heterostructure 10. Polarization field enhanced tunnel heterostructure 10 includes an n-type GaN bottom layer 60, an InGaN intermediate layer 62, and a p-type GaN top layer 64. A p-type AlGaN cladding layer 66 and a p-type GaN waveguide layer 68 may be formed over the p-type GaN top layer 64. An InGaN multi-quantum well layer 70 may be disposed between the p-type GaN waveguide layer 68 and an n-type GaN waveguide layer 72 and an overlying n-type AlGaN cladding layer 76. An n-type GaN contact layer 77 is disposed over the AlGaN cladding layer 76. A silicon dioxide insulating layer 78 is deposited over the laser structure. A via 80 is formed through silicon dioxide layer 78 to expose a portion of n-type GaN contact layer 77. Finally, a metal electrode 82 is deposited over n-type GaN contact layer 58 and a metal electrode 84 is deposited over n-type GaN contact layer 77. In this embodiment, tunnel diode heterostructure 10 provides a low-voltage contact junction between the p side of semiconductor laser 52 and an n-type conductivity channel provided by contact layer 58. In this way, tunnel diode heterostructure 10 avoids the need for a p-type current-carrying layer, which often is characterized by a low carrier density, a low mobility, and a high resistance for lateral conduction. In addition, tunnel diode heterostructure 10 allows design of a laser structure that avoids the high contact resistance between p-type layers and metal contacts.

In other embodiments, polarization field enhanced tunnel heterostructure 10 may operate as a tunnel contact junction in one or more other regions of a light emitting diode or a semiconductor laser device. For example, tunnel heterostructure 10 may be used as a hole source to avoid p-type layers, such as p-type AlGaN layers, which are poor electrical conductors. Tunnel heterostructure 10 also may be used as a tunnel contact between a p-type layer and a metal contact.

In other embodiments, the constituent layers of laser 42 may be formed from different III-V nitride semiconductor materials or from II-VI semiconductor materials. In addition, polarization field enhanced tunnel heterostructure 10 may be implemented as a tunnel contact to provide a low-voltage drop p-type contact in other semiconductor devices, including light-emitting diodes and vertical cavity surface emitting lasers (VCSELs).

Other embodiments are within the scope of the claims.

What is claimed is:

1. A heterostructure, comprising:
   a first semiconductor layer;
   a second semiconductor layer; and
   an intermediate semiconductor layer sandwiched between the first and second semiconductor layers and forming first and second heterointerfaces respectively therewith, wherein the first and second heterointerfaces are characterized by respective polarization charge regions producing a polarization field across the intermediate semiconductor layer promoting charge carrier tunneling through the intermediate semiconductor layer, wherein the polarization field has a magnitude ($\xi_p$) sufficient to align conduction band states at the Fermi level at the first heterointerface with valence band states at the Fermi level at the second heterointerface.

2. The heterostructure of claim 1, wherein the intermediate semiconductor layer has a thickness (D) enabling charge carriers to tunnel through the intermediate semiconductor layer with a substantial probability.

3. The heterostructure of claim 2, wherein $\xi_p$ has a value on the order of $(E_{c,1}-E_{v,2})/(q \cdot D)$, wherein $E_{c,1}$ is a relative conduction band energy at the first heterointerface, $E_{v,2}$ is a relative valence band energy at the second heterointerface, q is a unit carrier charge, and D is the thickness of the intermediate semiconductor layer.

4. The heterostructure of claim 1, wherein the first semiconductor layer is doped n-type and the second semiconductor layer is doped p-type.

5. The heterostructure of claim 4, wherein the polarization field enhances a dopant-induced drift field produced between the first and second semiconductor layers.

6. The heterostructure of claim 1, wherein the first and second semiconductor layers are formed from the same semiconductor material.

7. The heterostructure of claim 6, wherein the first and second semiconductor layers are formed from GaN and the intermediate semiconductor layer is formed from AlGaN.

8. The heterostructure of claim 6, wherein the first and second semiconductor layers are formed from GaN and the intermediate semiconductor layer is formed from InGaN.

9. The heterostructure of claim 1, wherein the first, second and intermediate semiconductor layers are characterized by crystallographic structures allowing spontaneous polarization charge formation at the first and second heterointerfaces.

10. The heterostructure of claim 9, wherein each of the first, second and intermediate semiconductor layers has a hexagonal crystallographic structure.

11. The heterostructure of claim 9, wherein each of the first, second and intermediate semiconductor layers is formed from a III-V nitride semiconductor material.

12. The heterostructure of claim 11, wherein each of the first, second and intermediate semiconductor layers is formed from a semiconductor material selected from the group consisting of: GaN, AlGaN, InGaN, AlN, InN, InAlN.

13. The heterostructure of claim 9, wherein each of the first, second and intermediate semiconductor layers is formed from a II-VI semiconductor material.

14. The heterostructure of claim 1, wherein each of the first and second heterointerfaces is characterized by a substantial piezoelectric charge formation.

15. The heterostructure of claim 1, wherein $\xi_p$ has a magnitude sufficient to enable tunneling through the intermediate semiconductor layer at infinitesimal applied bias.

16. A heterostructure, comprising:
   a semiconductor structure having a p-type region; and
   a tunnel contact structure disposed between the p-type region of the semiconductor structure and an adjacent n-type region, wherein the tunnel contact structure includes,
   a first semiconductor layer coupled to the n-type region and doped n-type,
   a second semiconductor layer coupled to the p-type region of the semiconductor structure and doped p-type, and
   an intermediate semiconductor layer sandwiched between the first and second semiconductor layers and forming first and second heterointerfaces respectively therewith, wherein the first and second heterointerfaces are characterized by respective polarization charge regions producing a polarization field across the intermediate semiconductor layer promoting charge carrier tunneling through the intermediate semiconductor layer, wherein the intermediate semiconductor layer has a thickness (D) enabling charge carriers to tunnel through the intermediate semiconductor layer with substantial probability and the polarization field has a magnitude ($\xi_p$) sufficient to align conduction band states at the Fermi level at the first heterointerface with the valence band states at the Fermi level at the second heteroface.

17. The heterostructure of claim 16, wherein the semiconductor structure comprises a light emitting region.

18. The heterostructure of claim 16, wherein each of the first, second and intermediate semiconductor layers is formed from a III-V nitride semiconductor material or a II-VI semiconductor material.

* * * * *